United States Patent
Weng et al.

(10) Patent No.: US 8,809,202 B2
(45) Date of Patent: Aug. 19, 2014

(54) METHODS OF MANUFACTURING SEMICONDUCTOR DEVICES INCLUDING USE OF A PROTECTIVE MATERIAL

(75) Inventors: Chih-Hui Weng, Tainan (TW); Wei-Sheng Yun, Taipei (TW); Shao-Ming Yu, Zhubei (TW); Hsin-Chih Chen, Tucheng (TW); Chih-Hsin Ko, Fongshan (TW); Clement Hsingjen Wann, Carmel, NY (US)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 115 days.

(21) Appl. No.: 13/396,515

(22) Filed: Feb. 14, 2012

(65) Prior Publication Data

US 2013/0210212 A1    Aug. 15, 2013

(51) Int. Cl.
*H01L 21/31* (2006.01)

(52) U.S. Cl.
USPC ........... 438/761; 438/763; 438/778; 438/787; 438/791

(58) Field of Classification Search
None
See application file for complete search history.

(56) References Cited

U.S. PATENT DOCUMENTS

| | | | | |
|---|---|---|---|---|
| 3,929,528 A | * | 12/1975 | Davidson et al. | 438/413 |
| 4,017,341 A | * | 4/1977 | Suzuki et al. | 438/404 |
| 4,662,956 A | * | 5/1987 | Roth et al. | 117/106 |
| 5,834,363 A | * | 11/1998 | Masanori | 438/507 |
| 6,154,366 A | * | 11/2000 | Ma et al. | 361/704 |
| 2008/0132043 A1 | * | 6/2008 | Kanemoto | 438/492 |

* cited by examiner

*Primary Examiner* — Scott B Geyer
(74) *Attorney, Agent, or Firm* — Slater and Matsil, L.L.P.

(57) ABSTRACT

Methods of manufacturing semiconductor devices are disclosed. In one embodiment, a method of manufacturing a semiconductor device includes providing a workpiece, and forming a protective material over a bottom surface and edges of the workpiece. A top surface of the workpiece is processed. The protective material protects the edges and the bottom surface of the workpiece during the processing of the top surface of the workpiece.

19 Claims, 5 Drawing Sheets

METHODS OF MANUFACTURING SEMICONDUCTOR DEVICES INCLUDING USE OF A PROTECTIVE MATERIAL

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon.

Dozens or hundreds of integrated circuits are typically manufactured on a single semiconductor wafer. The individual dies are singulated by sawing the integrated circuits along a scribe line. The individual dies are then packaged separately, in multi-chip modules, or in other types of packaging, for example.

The semiconductor industry continues to improve the integration density of various electronic components (e.g., transistors, diodes, resistors, capacitors, etc.) by continual reductions in minimum feature size, which allow more components to be integrated into a given area. As semiconductor devices are decreased in size, some manufacturing processes become more challenging.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of the embodiments of the present disclosure are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

Embodiments of the present disclosure are related to semiconductor device manufacturing methods. Novel manufacturing processes for semiconductor devices will be described herein. A protective layer is formed on edges and a bottom surface of a workpiece, so that subsequent manufacturing processing steps do not affect the edges and bottom surface of the workpiece.

Figure 1:
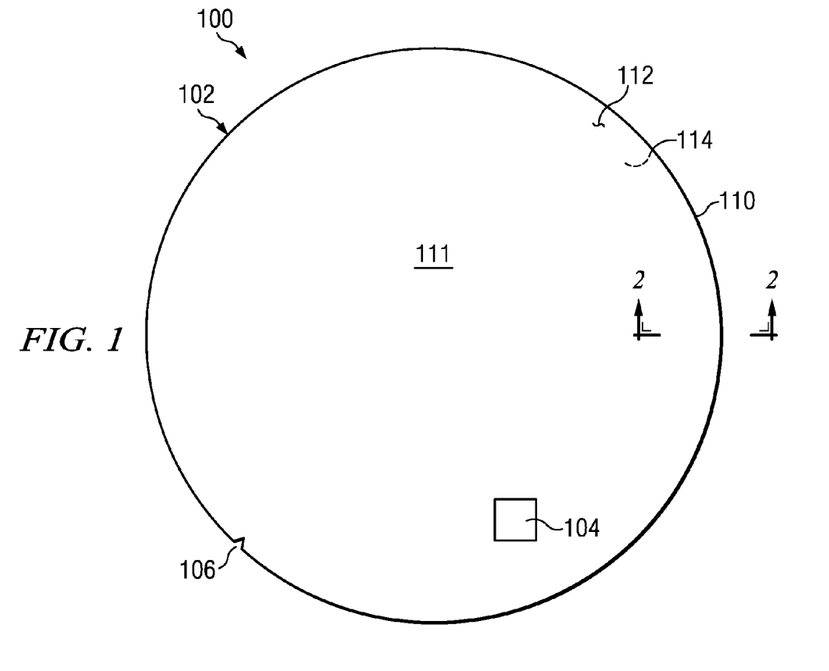
FIG. 1 shows a top view of a workpiece for manufacturing a plurality of semiconductor dies.

Referring first to FIG. 1, to manufacture a semiconductor device 100 in accordance with embodiments, a workpiece 102 is provided. A top view of a semiconductor device 100 comprising the workpiece 102 is shown. The workpiece 102 may include a semiconductor substrate comprising silicon or other semiconductor materials and may be covered by an insulating layer, for example. The workpiece 102 may also include other active components or circuits, not shown. The workpiece 102 may comprise silicon oxide over single-crystal silicon, for example. The workpiece 102 may include other conductive layers or other semiconductor elements, e.g., transistors, diodes, etc. Compound semiconductors, GaAs, InP, Si/Ge, or SiC, as examples, may be used in place of silicon. The workpiece 102 may comprise a silicon-on-insulator (SOI) or a germanium-on-insulator (GOI) substrate, as examples.

The workpiece 102 will be used to manufacture a plurality of dies 104 thereon. Only one die 104 is shown in FIG. 1; however, there may be dozens or hundreds of dies 104 formed across a top surface 112 of the workpiece 102. The dies 104 may be arranged in a grid-like pattern over the top surface 112, for example. The workpiece 102 may include one or more notches 106 that may be used for aligning the workpiece 102 during the various processing steps, for example. Alternatively, the workpiece 102 may include one or more flat sides that may be used for alignment, not shown. The workpiece 102 includes edges 110, a top surface 112, and a bottom surface 114 opposite the top surface 112. The workpiece 102 includes a central region 111 disposed within the edge 110 region.

Figure 2:
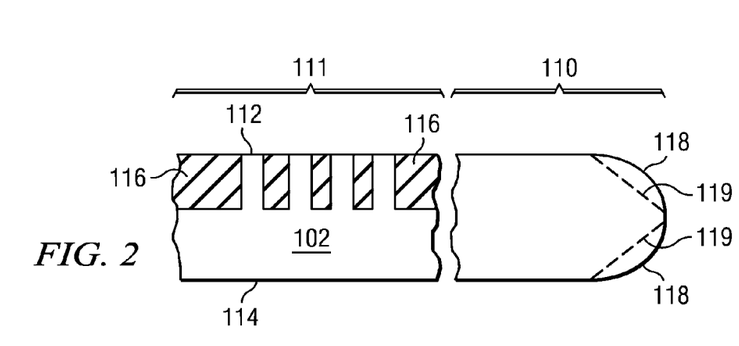
FIG. 2 is a cross-sectional view of a portion of the workpiece shown in FIG. 1 proximate an edge region.

FIG. 2 is a cross-sectional view of a portion of the workpiece 102 shown in FIG. 1 proximate an edge 110 region. A portion of the central region 111 is also shown. In some embodiments, the workpiece 102 may include a plurality of isolation regions 116 formed therein. The plurality of isolation regions 116 may comprise a depth of about 500 nm or less below the top surface 112 of the workpiece 102 and a width of about 100 nm or less, as examples. The plurality of isolation regions 116 may extend, e.g., in and out of the paper in the view shown, by up to several μm, for example. Alternatively, the plurality of isolation regions 116 may comprise other dimensions.

The isolation regions 116 may comprise shallow trench isolation (STI) regions or field oxide (FOX) regions, as examples. The isolation regions 116 may comprise an oxide, a nitride, other insulators, or multiple layers or combinations thereof, as examples. In some embodiments, the isolation regions 116 may comprise silicon dioxide. Alternatively, the isolation regions 116 may comprise other materials. The isolation regions 116 may be formed by patterning the workpiece 102, and filling the patterned workpiece 102 with insulating material to form the isolation regions 116, for example.

Portions of the workpiece 102 may reside between the isolation regions 116. The portions of the workpiece 102 residing between the isolation regions 116 may comprise regions where channels of transistors will be formed, in some embodiments. The top portions of the workpiece 102 residing between the isolation regions 116 may comprise a width of about 5 to 100 nm, for example. The portions of the workpiece 102 may extend, e.g., in and out of the paper in the view shown, by up to several μm, for example. Alternatively, the portions of the workpiece 102 may comprise other dimensions.

The edge 110 regions may be curved at a bottom and top surface thereof, as shown at 118 in FIG. 2. In other embodiments, the edge 110 regions may be beveled (e.g., angled) at a bottom and top surface thereof, as shown in phantom at 119 in FIG. 2. Alternatively, the edge 110 regions may be substantially rectangular in some embodiments, as shown in FIGS. 3 through 12. The edge 110 regions may alternatively comprise other shapes. The shape of the edge 110 regions may vary based on the manufacturing process or crystalline structure of the workpiece 102, for example.

In accordance with embodiments, a protective material 130 is formed over the bottom surface 114 and edges 110 of the workpiece 102 before the top surface 112 of the workpiece 102 is processed, as shown in FIGS. 3 through 9 in cross-sectional views at various stages of manufacturing of the semiconductor device 100. The protective material 130 protects the edges 110 and the bottom surface 114 of the workpiece 102 during subsequent processing of the top surface 112 of the workpiece 102, as shown in cross-sectional views in FIGS. 10 and 11.

Figure 3:
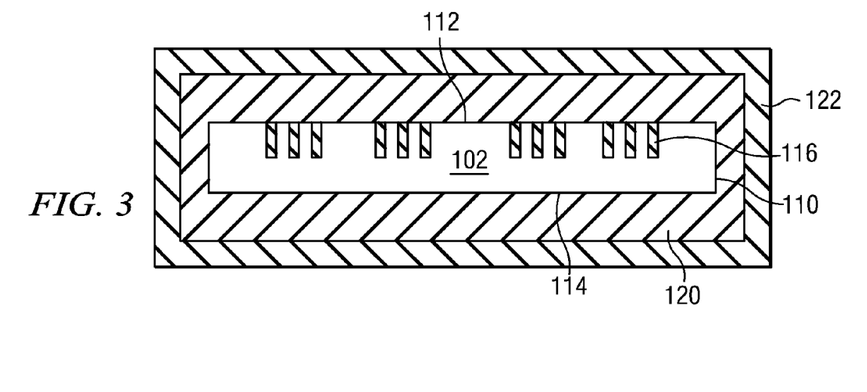
FIGS. 3 through 11 illustrate cross-sectional views of a method of manufacturing a semiconductor device at various stages in accordance with an embodiment of the present disclosure.

To form the protective material 130, first, in an optional step, if a pad oxide (not shown in the drawings) is present on the top surface 112 of the workpiece 102, the pad oxide is removed. A first layer 120 is then formed over the edges 110, the top surface 112, and the bottom surface 114 of the workpiece 102, as shown in FIG. 3. The first layer 120 comprises an insulating material. In some embodiments, the first layer 120 comprises a nitride material. The first layer 120 may comprise a layer of silicon nitride having a thickness of about 5 to 50 nm formed by atomic layer deposition (ALD), chemical vapor deposition (CVD), physical vapor deposition (PVD), or plasma-enhanced CVD (PECVD), as examples. Alternatively, the first layer 120 may comprise other materials and dimensions, and may be formed using other methods.

A second layer 122 is formed over the first layer 120, e.g., over the edges 110, the top surface 112, and the bottom surface 114 of the workpiece 102, also shown in FIG. 3. The second layer 122 comprises an insulating material. In some embodiments, the second layer 122 comprises an oxide material. The second layer 122 may comprise a material having an etch selectivity to the material of the first layer 120, for example. The second layer 122 may comprise a layer of bis-(tertiary butyl amino)-silane (BTBAS) oxide having a thickness of about 5 to 50 nm formed by introducing a precursor of BTBAS and other chemicals into a chamber (not shown in the figures) the semiconductor device 100 is being processed in, for example. Alternatively, the second layer 122 may be formed by ALD, CVD, PVD, or PECVD, as examples. The second layer 122 may also comprise other materials and dimensions, and may be formed using other methods.

Figure 4:
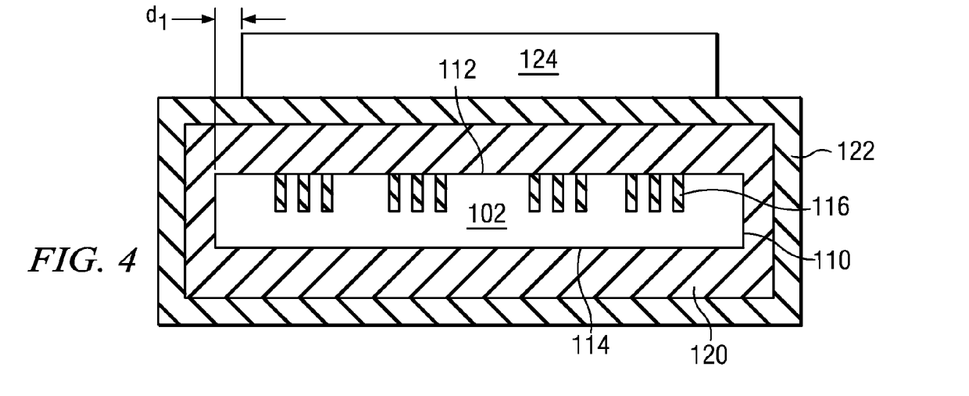

A layer of photoresist 124 is formed over the workpiece 102, as shown in FIG. 4. The layer of photoresist 124 may be sputtered on or applied using other methods, so that the layer of photoresist 124 is primarily only formed over the top surface 112 of the workpiece 102, for example. The application process for the layer of photoresist 124 may result in edge 110 regions of the workpiece 102 that are not coated with the photoresist 124; e.g., a sputter process may not apply the layer of photoresist 124 completely to the edges 110. The edge 110 regions may have a thickness comprising dimension $d_1$ of about 1 to 5 mm, as an example, although alternatively, the edge 110 regions may comprise other dimensions in a lateral direction in the cross-sectional views shown.

Figure 5:
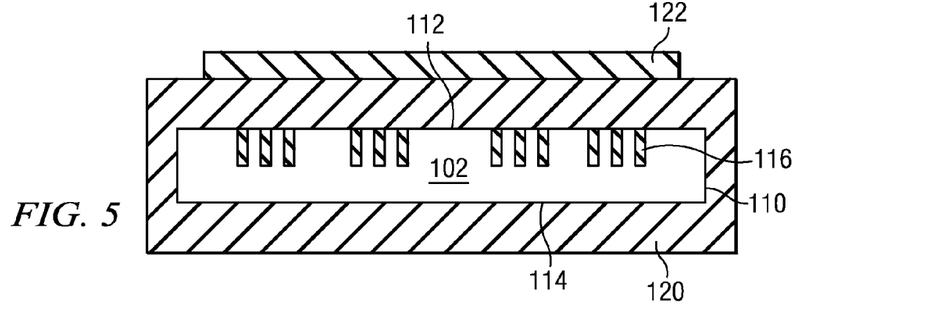

Next, the second layer 122 is removed from over the edges 110 and the bottom surface 114 of the workpiece 102, as shown in FIG. 5. The second layer 122 may be removed by using the patterned photoresist 124 as an etch mask during an etch process, for example. The layer of photoresist 124 may then optionally be removed.

Figure 6:
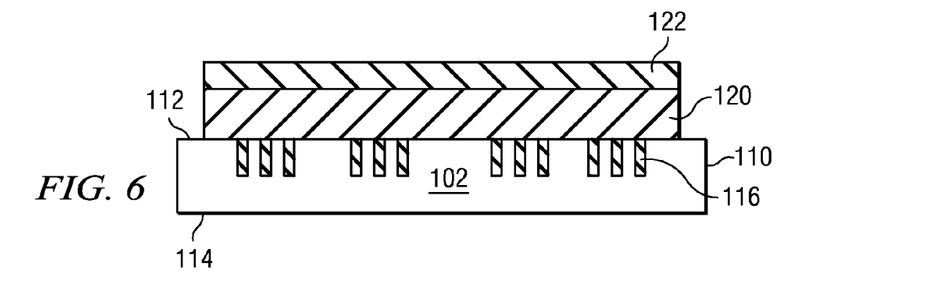
Figure 7:
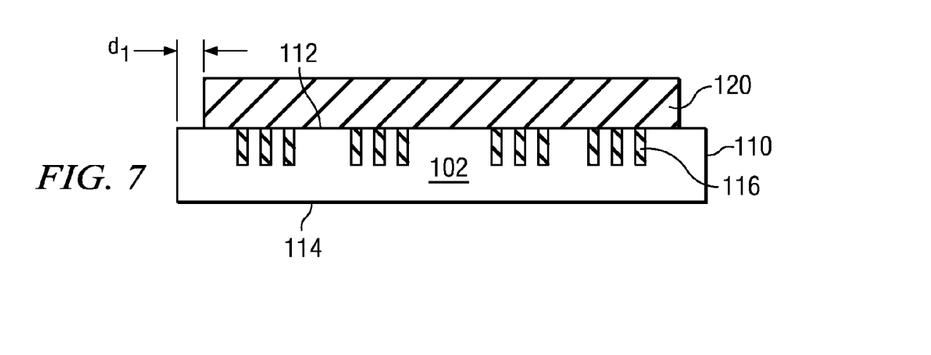

The first layer 120 is then removed from over the edges 110 and the bottom surface 114 of the workpiece 102, as shown in FIG. 6. The first layer 120 may be removed by using the patterned second layer 122 as an etch mask during an etch process, for example. Alternatively, the photoresist 124 may be left remaining over the second layer 122, and the photoresist 124, and optionally also the second layer 122, may be used as an etch mask during an etch process, for example. The second layer 122 is then removed from over the first layer 120, e.g., the second layer 122 is removed from over the top surface 112 of the workpiece 102, as shown in FIG. 7.

Advantageously, in accordance with some embodiments, the first layer 120 and the second layer 122 materials are selected so that they have etch selectivity to one another, so that the first layer 120 may be removed selective to the second layer 122, and vice versa.

Figure 8:
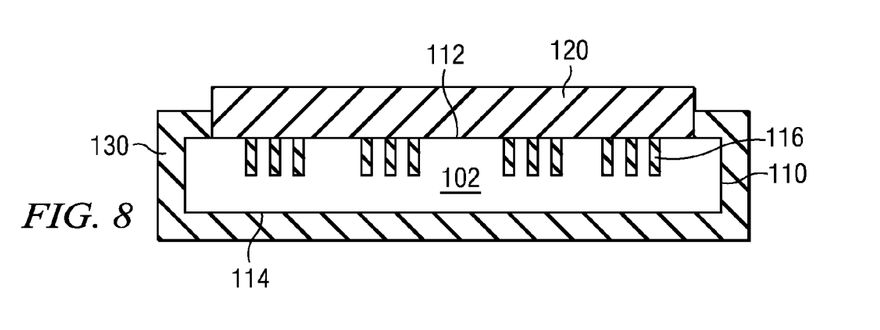

Next, a third layer 130 is formed over the edges 110 and the bottom surface 114 of the workpiece 102, as shown in FIG. 8. The third layer 130 is also referred to herein as a protective layer or a layer of silicon dioxide. The first layer 120 and the second layer 122 comprise sacrificial material layers that are used to form the protective layer 130. The third layer 130 may comprise an insulating material. The third layer 130 may comprise an oxide such as silicon dioxide or other oxide materials in some embodiments. The third layer 130 is formed using a process that forms the third layer 130 over the edges 110 and bottom surface 114 of the workpiece 102, but not over the first layer 120 on the top surface of the workpiece 102, in some embodiments. The third layer 130 may be thermally grown in some embodiments, by introducing a precursor such as silane and/or other chemicals into the chamber the workpiece 102 is being processed in, for example. The third layer 130 may have a thickness of about 5 to 100 nm, for example. The third layer 130 comprises a thickness of 100 nm or less in some embodiments. Alternatively, the third layer 130 may comprise other materials and dimensions, and may be formed using other methods. In some embodiments, the first layer 120 comprises a material selected so that the material of the third layer 130 does not form on the first layer 120 during the formation of the third layer 130, such as a nitride, as an example.

Alternatively, in other embodiments, the first layer 120 may comprise an oxide, and the third layer 130 may comprise a nitride. In such embodiments, the second layer 122 may also comprise a nitride rather than an oxide, to provide etch selectively between the first and second layers 120 and 122, for example.

The etch processes for the first layer 120, the second layer 122, and the third layer 130 may comprise wet etch processes that have etch selectivity to the materials selected for the first layer 120, the second layer 122, and the third layer 130, for example.

Figure 9:
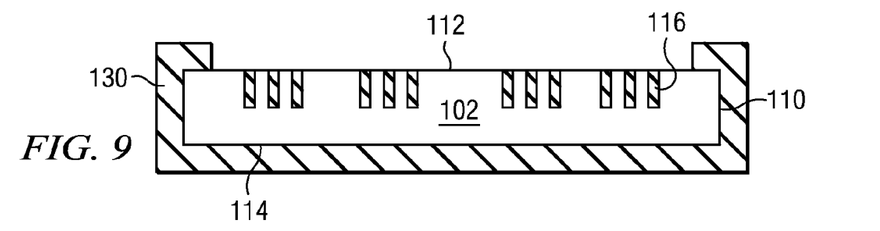

After the third layer 130 is formed, the first layer 120 is removed from the top surface of the workpiece 102, as shown in FIG. 9. Again, advantageously, because the first layer 120 and the third layer 130 have etch selectivity with respect to each other, the first layer 120 may be removed using an etch chemistry designed to remove the first layer 120 but not remove the third layer 130.

Figure 10:
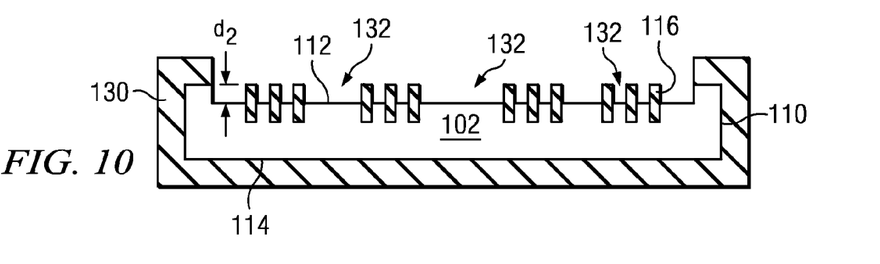
Figure 11:
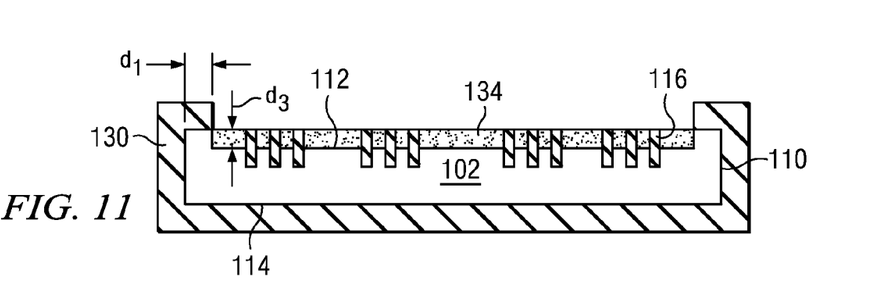

Next, a process or a plurality of processes is then performed on the top surface 112 of the workpiece 102, as shown in FIGS. 10 and 11. The third layer 130 advantageously protects the edges 110 and bottom surface 114 of the workpiece 102 during the process or processes. The process illustrated in FIGS. 10 and 11 is merely an example: many other types of processes may alternatively be performed on the top surface 112 of the workpiece 102 in accordance with embodiments of the present disclosure.

The exemplary process shown in FIGS. 10 and 11 comprises forming an epitaxial material 134 in channel regions 150 of transistors 140 (see FIG. 12) to form transistors 140 having stressed channel regions 150. Referring next to FIG. 10, the top surface 112 of the workpiece 102 is recessed between the isolation regions 116 using an etch process by a vertical height comprising dimension $d_2$, which may comprise about 5 to 100 nm, as an example, although alternatively, dimension $d_2$ may comprise other values. The etch process removes a top portion of the top surface 112 of the workpiece 102, forming recesses 132 between the isolation regions 116, as shown. The third layer 130 protects the edges 110 and bottom surface 114 of the workpiece 102 during the etch process used to form the recesses 132, advantageously.

The recesses 132 are filled with a semiconductive material 134, as shown in FIG. 11. The semiconductive material 134 may be formed using an epitaxial growth process in some embodiments. The semiconductive material 134 comprises SiGe in some embodiments, although alternatively, the semiconductive material 134 may comprise other materials, such as SiC or other materials, as examples. The third layer 130 protects the edges 110 and bottom surface 114 of the workpiece 102 during the epitaxial growth process of the semiconductive material 134, advantageously.

The semiconductive material 134 comprises a thickness having a dimension $d_3$ which may be substantially the same as dimension $d_2$ of the depth of the recesses 132 in some embodiments. In other embodiments, dimension $d_3$ may be greater than, or less than, dimension $d_2$, for example.

Figure 12:
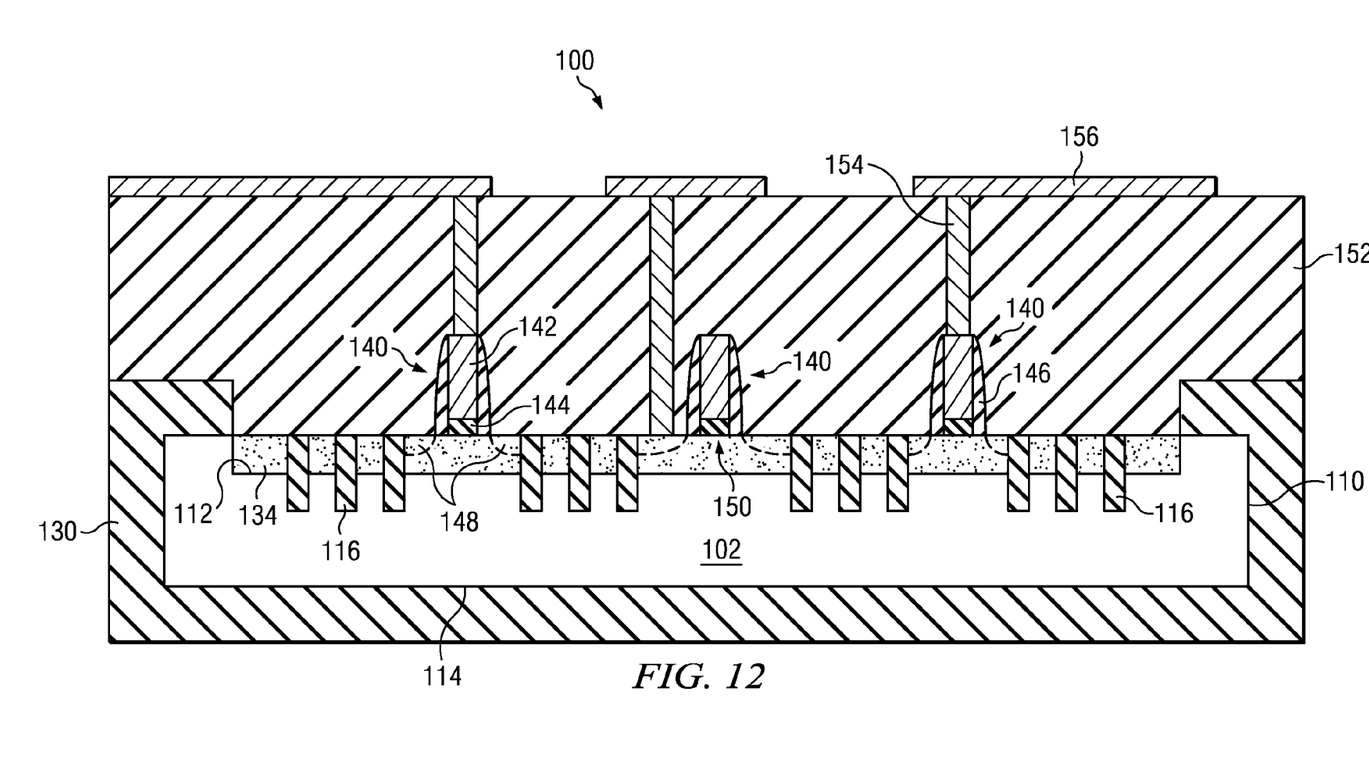
FIG. 12 is a cross-sectional view of a plurality of transistors formed on a semiconductor device using an embodiment described herein.

The manufacturing process for the semiconductor device 100 is then continued to form the structure shown in FIG. 12, which is a cross-sectional view of a plurality of transistors 140 formed on a semiconductor device 100 using an embodiment described herein. The transistors 140 may be formed over the top surface 112 of the workpiece 102. Other devices and components may optionally be formed in other regions of the workpiece 102, not shown. The transistors 140 may be formed by forming a gate dielectric 144 and a gate 142 over the workpiece 102 over the semiconductive material 134, forming sidewall spacers 146 over the gate 142 and gate dielectric 144, and forming source and drain regions 148 in the workpiece 102 proximate the gate 142 and gate dielectric 144, e.g., using one or more implantation processes or other methods. The channel regions 150 of the transistors 140 comprise the epitaxially grown semiconductive material 134 which may comprise a predetermined amount of stress that improves the transistor 140 performance, for example. The transistors 140 may comprise p-channel metal oxide semiconductor (PMOS) and/or n-channel MOS (NMOS) devices, as examples. Alternatively, the transistors 140 may comprise other types of transistors or devices.

The manufacturing process for the semiconductor device 100 may then been be continued to complete the device 100. One or more insulating material layers 152 may be formed over the transistors 140 and exposed portions of the workpiece 102, and contacts (or vias) 154 may be formed in the insulating material layers 152 that connect the underlying devices or components of devices, such as the gates 142 and source and drain regions 148 of the transistors 140, to overlying conductive lines 156, for example. Additional insulating material layers, conductive material layers, and/or contact pads may be formed over the conductive lines 156 (not shown). Individual dies 104 (see FIG. 1) may then be singulated or separated from the wafer, and the dies 104 may be packaged, singly or in multiple chip packages, for example (also not shown).

Figure 13:
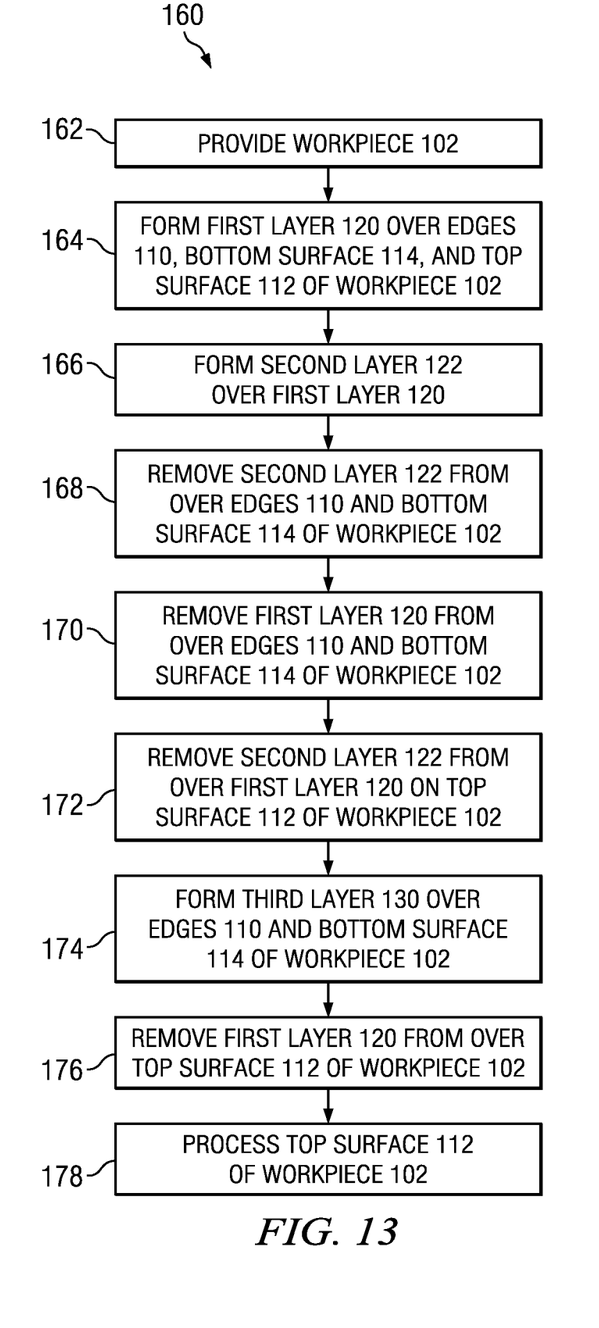
FIG. 13 is a flow chart of a method of manufacturing a semiconductor device in accordance with an embodiment.

FIG. 13 is a flow chart 160 illustrating a method of manufacturing a semiconductor device 100 in accordance with an embodiment. The method includes providing a workpiece 102 (step 162), forming a first layer 120 over the edges 110 of the workpiece 102, the bottom surface 114 of the workpiece 102, and the top surface 112 of the workpiece 102 (step 164), and forming a second layer 122 over the first layer 120 (step 166). The second layer 122 is removed from over the edges 110 and the bottom surface 114 of the workpiece 102 (step 168), and the first layer 120 is also removed from over the edges 110 and the bottom surface 114 of the workpiece 102 (step 170). The method includes removing the second layer 122 from over the first layer 120 on the top surface 112 of the workpiece 102 (step 172), and forming a third layer 130 over the edges 110 and the bottom surface 114 of the workpiece 102 (step 174). The first layer 120 is removed from over the top surface 112 of the workpiece 102 (step 176), and the top surface 112 of the workpiece 102 is then processed (step 178), as described herein with reference to FIGS. 10 and 11, or using another type of semiconductor device processing method or methods, for example.

Advantages of embodiments of the disclosure include providing novel manufacturing methods wherein edges 110 and bottom surfaces 114 of the workpiece 102 are protected from damage or undesired alteration during manufacturing processes for the top surface 112. In some applications, introducing contaminants into the manufacturing environment is prevented, by not exposing the edges 110 and bottom surfaces 114 of the workpiece 102 to the processing methods used on the top surface 112 of the workpiece 102. As one example, in the embodiment shown in FIGS. 11 and 12, exposing the edges 110 and bottom surfaces 114 of the workpiece 102 to the epitaxial growth process for the semiconductive material 134 avoids introducing excess dopants and/or semiconductive material, which may have a potential to cause a large amount of contamination in the manufacturing environment, depending on the materials used in the epitaxial growth process for the semiconductive material 134.

The novel methods described herein are easily implementable in manufacturing process flows. Reduced costs, reduced defects, and improved yields are also achievable by the use of the novel manufacturing methods described herein. Embodiments of the present disclosure may be particularly beneficial when used for workpieces 102 having curved or beveled edges 110, for example.

In accordance with one embodiment of the present disclosure, a method of manufacturing a semiconductor device includes providing a workpiece, and forming a protective material over a bottom surface and edges of the workpiece. A top surface of the workpiece is processed. The protective material protects the edges and the bottom surface of the workpiece during the processing of the top surface of the workpiece.

In accordance with another embodiment, a method of manufacturing a semiconductor device includes providing a workpiece, forming a first layer over edges, a bottom surface, and a top surface of the workpiece, and forming a second layer over the first layer. The second layer is removed from over the edges and the bottom surface of the workpiece, and the first layer is also removed from over the edges and the bottom surface of the workpiece. The method includes removing the second layer from over the first layer on the top surface of the workpiece, and forming a third layer over the edges and the bottom surface of the workpiece. The first layer is removed from over the top surface of the workpiece, and the top surface of the workpiece is processed. The third layer protects the edges and the bottom surface of the workpiece during the processing of the top surface of the workpiece.

In accordance with yet another embodiment, a method of manufacturing a semiconductor device includes providing a workpiece having a top surface, a bottom surface, and edges. A plurality of channel regions are formed proximate the top surface of the workpiece, and a layer of silicon nitride is formed over the top surface, the bottom surface, and the edges of the workpiece. A layer of bis-(tertiary butyl amino)-silane (BTBAS) oxide is formed over the layer of silicon nitride, and a layer of photoresist is formed over the top surface of the workpiece over the layer of BTBAS oxide. The layer of photoresist is used as a mask to remove the layer of BTBAS oxide from over the bottom surface and the edges of the workpiece, and the layer of photoresist is removed. The layer of BTBAS oxide is used as a mask to remove the layer of silicon nitride from over the bottom surface and the edges of the workpiece, and the layer of BTBAS oxide is removed from over the top surface of the workpiece. The method includes thermally growing a layer of silicon dioxide over the bottom surface and the edges of the workpiece, and removing the layer of silicon nitride from the top surface of the workpiece. A top portion of the plurality of channel regions is removed, forming recessed regions in the plurality of channel regions. A semiconductive material is epitaxially grown in the recessed regions in the plurality of channel regions. The layer of silicon dioxide over the bottom surface and the edges of the workpiece prevents the semiconductive material from forming on the bottom surface and the edges of the workpiece.

Although embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method of manufacturing a semiconductor device, the method comprising:
    providing a workpiece;
    forming a protective material over a bottom surface and edges of the workpiece, wherein forming the protective material comprises forming a mask over the bottom surface, a top surface, and the edges of the workpiece, removing the mask from the edges and the bottom surface of the workpiece, forming the protective material over the bottom surface and the edges of the workpiece, and removing the mask from the top surface of the workpiece; and
    processing the top surface of the workpiece, wherein processing the top surface of the workpiece comprises epitaxially growing a material, and wherein the protective material protects the edges and the bottom surface of the workpiece during the processing of the top surface of the workpiece by preventing the epitaxially grown material from forming on the edges and the bottom surface of the workpiece.

2. The method according to claim 1, wherein forming the protective material comprises forming an insulating material.

3. The method according to claim 1, wherein the mask comprises a first layer and a second layer, and wherein forming the protective material comprises forming the first layer over the bottom surface, the top surface, and the edges of the workpiece, forming the second layer over the first layer, removing the second layer from the edges and the bottom surface of the workpiece, removing the first layer from the edges and the bottom surface of the workpiece, removing the second layer from the top surface of the workpiece, forming a third layer on the edges and the bottom surface of the workpiece, and removing the first layer from the top surface of the workpiece.

4. The method according to claim 3, wherein forming the first layer comprises forming a nitride material, wherein forming the second layer comprises forming an oxide material, and wherein forming the third layer comprises forming an oxide material.

5. The method according to claim 1, wherein processing the top surface of the workpiece further comprises recessing a top portion of the workpiece, and epitaxially growing the material in the recessed top portion of the workpiece.

6. The method according to claim 1, wherein epitaxially growing the material comprises forming SiGe or SiC.

7. A method of manufacturing a semiconductor device, the method comprising:
    providing a workpiece;
    forming a first layer over edges, a bottom surface, and a top surface of the workpiece;
    forming a second layer over the first layer;
    removing the second layer from over the edges and the bottom surface of the workpiece;
    removing the first layer from over the edges and the bottom surface of the workpiece;
    removing the second layer from over the first layer on the top surface of the workpiece;
    forming a third layer over the edges and the bottom surface of the workpiece;
    removing the first layer from over the top surface of the workpiece; and
    processing the top surface of the workpiece, wherein the third layer protects the edges and the bottom surface of the workpiece during the processing of the top surface of the workpiece.

8. The method according to claim 7, wherein forming the first layer comprises forming silicon nitride.

9. The method according to claim 7, wherein forming the second layer comprises forming bis-(tertiary butyl amino)-silane (BTBAS) oxide.

10. The method according to claim 7, wherein forming the third layer comprises forming silicon dioxide.

11. The method according to claim 10, wherein forming the silicon dioxide comprises thermally growing the silicon dioxide.

12. The method according to claim 7, wherein processing the top surface of the workpiece comprises removing material in channel regions of the workpiece.

13. The method according to claim 12, wherein processing the top surface of the workpiece further comprises epitaxially growing a semiconductive material in the channel regions of the workpiece.

14. A method of manufacturing a semiconductor device, the method comprising:
    providing a workpiece, the workpiece having a top surface, a bottom surface, and edges;
    forming a plurality of channel regions proximate the top surface of the workpiece;
    forming a layer of silicon nitride over the top surface, the bottom surface, and the edges of the workpiece;
    forming a layer of bis-(tertiary butyl amino)-silane (BT-BAS) oxide over the layer of silicon nitride;
    forming a layer of photoresist over the top surface of the workpiece over the layer of BTBAS oxide;
    using the layer of photoresist as a mask to remove the layer of BTBAS oxide from over the bottom surface and the edges of the workpiece;
    removing the layer of photoresist;
    using the layer of BTBAS oxide as a mask to remove the layer of silicon nitride from over the bottom surface and the edges of the workpiece;
    removing the layer of BTBAS oxide from over the top surface of the workpiece;
    thermally growing a layer of silicon dioxide over the bottom surface and the edges of the workpiece;
    removing the layer of silicon nitride from the top surface of the workpiece;
    removing a top portion of the plurality of channel regions, forming recessed regions in the plurality of channel regions; and
    epitaxially growing a semiconductive material in the recessed regions in the plurality of channel regions, wherein the layer of silicon dioxide over the bottom surface and the edges of the workpiece prevents the semiconductive material from forming on the bottom surface and the edges of the workpiece.

15. The method according to claim 14, wherein forming the layer of silicon dioxide comprises forming a material layer having a thickness of about 50 nm or less.

16. The method according to claim 14, wherein providing the workpiece comprises providing a workpiece wherein the edges are curved.

17. The method according to claim 14, wherein providing the workpiece comprises providing a workpiece wherein the edges are beveled.

18. The method according to claim 14, further comprising forming shallow trench isolation (STI) regions proximate the plurality of channel regions.

19. The method according to claim 18, wherein removing the top portion of the plurality of channel regions comprises removing the top portion of the plurality of channel regions proximate the STI regions.

* * * * *